United States Patent [19]

Bright et al.

[11] Patent Number: 4,667,327
[45] Date of Patent: May 19, 1987

[54] ERROR CORRECTOR FOR A LINEAR FEEDBACK SHIFT REGISTER SEQUENCE

[75] Inventors: Michael W. Bright, Arlington Heights; Eric F. Ziolko, Schaumburg; Alan L. Wilson, Hoffman Estates, all of Ill.

[73] Assignee: Motorola, Inc., Schaumburg, Ill.

[21] Appl. No.: 719,385

[22] Filed: Apr. 2, 1985

[51] Int. Cl.[4] ............................................. G06F 11/10
[52] U.S. Cl. ...................................... 371/47; 371/40; 371/42; 371/45
[58] Field of Search ....................... 371/41, 40, 42, 45, 371/47, 43; 364/200, 900; 455/83; 375/116

[56] References Cited

U.S. PATENT DOCUMENTS

| | | | |
|---|---|---|---|
| 3,469,236 | 9/1969 | Gallager | 455/83 |
| 3,571,795 | 3/1971 | Tong | 371/44 |
| 3,605,090 | 9/1971 | Burton | 371/43 |
| 3,728,678 | 4/1973 | Tong | 455/83 |
| 3,859,630 | 1/1975 | Bennett | 340/146.1 |
| 3,873,971 | 3/1975 | En | 371/43 |
| 3,882,457 | 5/1975 | En | 371/45 |
| 4,001,779 | 1/1977 | Schiff | 340/146.1 |
| 4,032,886 | 6/1977 | En et al. | 371/45 |
| 4,055,832 | 10/1977 | En | 371/43 |
| 4,119,945 | 10/1978 | Lewis | 371/43 |
| 4,158,193 | 6/1979 | D'Antonio | 371/47 |
| 4,158,748 | 6/1979 | En | 375/116 |
| 4,217,660 | 8/1980 | En | 371/44 |
| 4,240,156 | 12/1980 | Doland | 371/43 |
| 4,312,070 | 1/1982 | Coombes et al. | 371/47 |
| 4,320,510 | 3/1982 | Kojima | 371/37 |
| 4,455,655 | 6/1984 | Galen et al. | 371/38 |
| 4,486,882 | 12/1984 | Piret | 371/45 |
| 4,547,887 | 10/1985 | Mui | 371/44 |

OTHER PUBLICATIONS

Sasnowitz, Encoding Scheme Reduces Hardware Requirements; NASA Tech. Briefs, pp. 157–158, Spring 1985.

*Primary Examiner*—Michael R. Fleming
*Attorney, Agent, or Firm*—Thomas G. Berry; Donald B. Southard

[57] ABSTRACT

Disclosed is an error corrector for a linear feedback shift register sequence employing an open loop linear feedback shift register (LFSR) having selected bits "tapped" and combined to form a feedback signal. The taps implement an orthogonal convolutional code that is inherently redundant, therefore, the transmission of parity bits is not required. The feedback signal is combined with the received synchronization signal to form an error estimate that is temporarily stored in a syndrome register. By majority voting a selected outputs of the syndrome register a reliable determination of a received error can be made. Once an error determination is made, a correction signal is generated to correct the bit in error thereby providing a high probability of initiating and maintaining synchronization.

10 Claims, 2 Drawing Figures

ERROR CORRECTOR FOR A LINEAR FEEDBACK SHIFT REGISTER SEQUENCE

BACKGROUND OF THE INVENTION

This invention relates generally to digital error correction and more particularly to digital error correction on selected orthogonal or semi-orthogonal codes generated in a linear feedback shift register (LFSR).

It is well known by those skilled in the art that in a synchronous data communication system synchronization information must be continuously or periodically sent from the transmitter to the receiver to initiate and maintain synchronization. Loss of synchronization can result in total loss of the transmitted information. Accordingly, it is imperative that a reliable means be found to increase the probablity of initiating and maintaining synchronization between a transmitter and one or more receivers.

A major problem in trying to synchronize a receiver to a transmitter is encountered when the synchronization information is corrupted by noise. Those skilled in the art will appreciate that a signal transmitted over a communication channel may become corrupted by noise due to atmospheric disturbances, physical disruptions in the channel or simply background random noise. Therefore, given that the synchronization information may be corrupted by noise, and thus received in error, some communication systems attempt to correct the received information to facilitate synchronization.

Prior art techniques have typically employed either parity bits interleaved between synchronization information bits or check word bits transmitted at the end of a synchronization bit sequence to attempt to correct errors at the receiver. However, transmitting either parity bits or check word bits (which are simply redundant synchronization information bits) reduces the synchronization information data rate because time is wasted sending the redundant information. Stated another way, the transmission of parity bits or check word bits requires additional bandwidth that may not be available in a crowded spectural environment.

Accordingly, a need exists to provide a reliable means of initiating and maintaining synchronization between a transmitter and one or more receivers that does not require the transmission of redundant information to enable synchronization information correction at the receivers.

SUMMARY OF THE INVENTION

The embodiment of this invention is to employ in the transmitter a closed loop linear feedback shift register (LFSR) having selected bits "tapped" and comblned to form a feedback signal. In the preferred embodiment the taps implement a maximal length, orthogonal convolutional code that is inherently redundant, therefore, the transmission of parity bits is not required. Stated alternatively, the next information bit is in fact the parity bit for the preceeding synchronization information bit. Since the code is maximal length, the maximum number of synchronization states is achieved and each synchronization state will eventually be followed by all other possible synchronization states, except the all zero state.

In the receiver, this invention employs an open loop LFSR having identically selected bits "tapped" and combined to form a feedback signal. As used herein, the term LFSR means that the feedback signal normally generated in standard LFSR's is not feed back into the input of the shift register. The feedback signal is combined with the received synchronization signal to form an error estimate that is temporarily stored in a syndrome register. By majority voting on selected outputs of the syndrome register a reliable determination of a received error can be made based on a predetermined threshold. Once an error determination is made, a correction signal is generated to correct the bit in error thereby providing a high probability of initiating and maintaining synchronization.

An error corrector in accordance with the present invention would be useful in any communication system that continuously or periodically transmits synchronization information over an independent synchronization channel or interleaved within an information signal on a single channel. Examples of communication systems that could employ the present invention include, but are not limited to, computer data communication systems, digitized voice communication systems (either encrypted or un-encrypted) or other such communication systems that transmit or receive information in digital form.

Therefore, it is an object of the present invention to provide a synchronization error corrector to increase the probability of initiating and maintaining synchronization without transmitting parity bits.

Accordingly, these and other objects are achieved in the present error corrector for a linear feedback shift register sequence.

BRIEF DESCRIPTION OF THE DRAWINGS

The features of the present invention which are believed to be novel are set forth with particularity in the appending claims. The invention, together with further objects and advantages thereof, may be understood by references to the following description, taken in conjunction with the accompanying drawings, and the several figures in which like reference numerals identify like elements, and in which:

DETAILED DESCRIPTION OF THE PREFERRED EMBODIMENT

Figure 1:
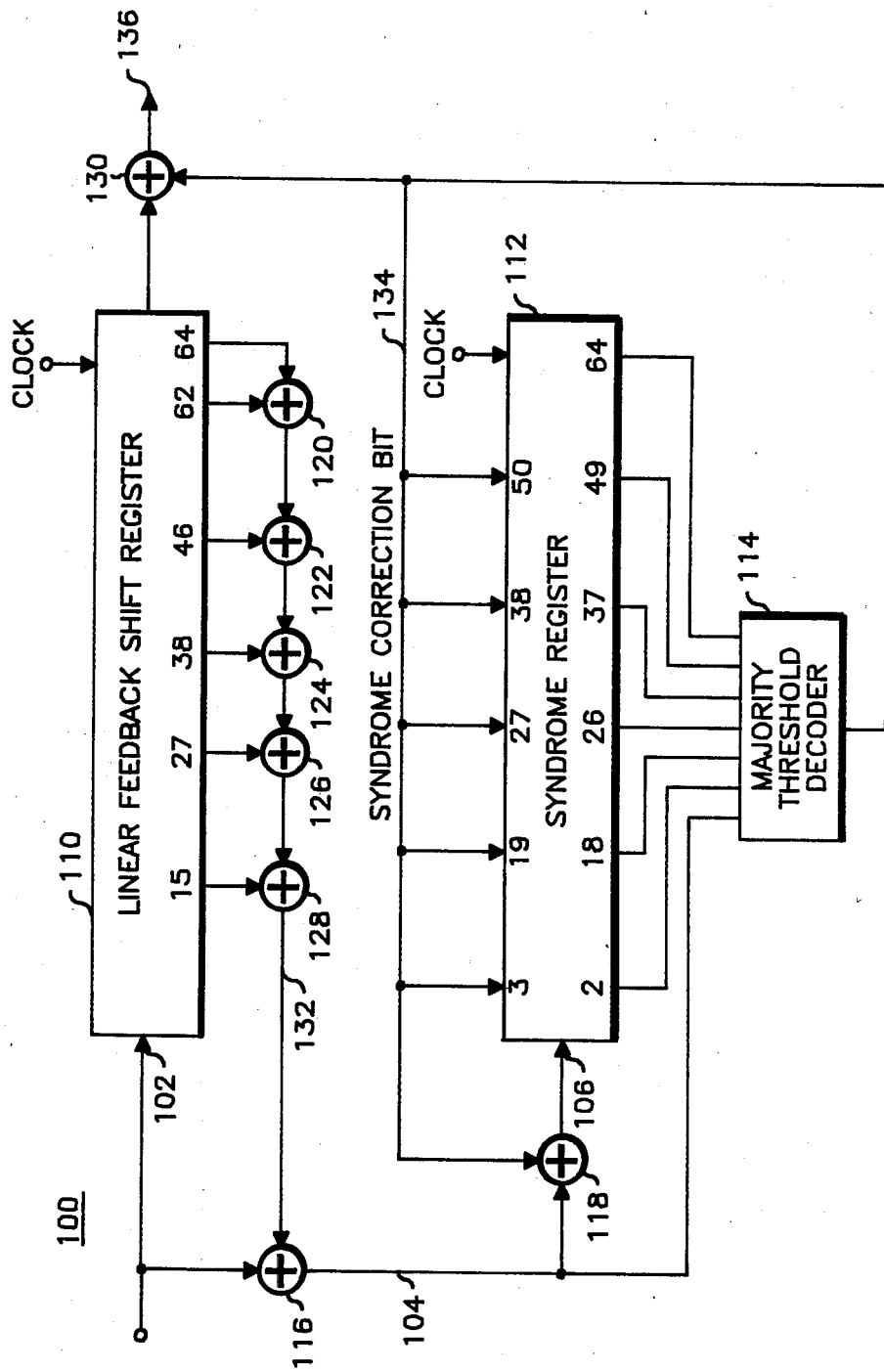
FIG. 1 is a block diagram of the synchronization error corrector following the teachings of the present invention.

Referring now to FIG. 1, error corrector 100 has a serial bit stream input port 102 consisting of a LFSR sequence that may have some bits in error. The error corrector outputs at port 136 the same serial bit stream with the errors corrected. Error corrector 100 is comprised of LFSR 110, syndrome register 112, majority threshold decoder 114 and binary summers, generally 116 through 130. LFSR 110 is a shift register whose primary purpose is to temporarily store the last N bits of a received synchronization sequence applied to its input 102 and to provide output ports along its entire length, or a portion thereof. Thus, LFSR 110 may be simply a cascaded string of "D" flip-flops, for example, MC14013B manufactured by Motorola, Inc. Alternately, LFSR 110 can be comprised of more specialized integrated circuits (IC's) such as cascaded sections of 8-bit static shift register MC14014B or MC14021B, manufactured by Motorola, Inc. The output ports along the length of LFSR 110 may be "tapped" and combined in many combinations to form a feedback signal 132. However, by judicious selection of these taps orthogonal or semiorthogonal codes can be generated that are inherently redundant and suitable for the purposes of the present invention.

In the preferred embodiment of the present invention these taps are placed at the 15th, 27th, 38th, 46th, 62nd, and 64th bits of LFSR 110. The six taps of LFSR 110 are combined in summers 120 through 128 to produce feedback signal 132. In the preferred combining method, bits 62 and 64 are first summed (modulo 2) in binary summer 120 the output of which is taken as a first input to binary summer 122. As a second input, binary summer 122 accept the 46th tap from LFSR 110 providing an output signal coupled to binary summer 124. As a second input, binary summer 124 accepts the 38th output port of LFSR 110 to produce a sum signal which is applied to binary summer 126. Binary summer 126 accepts as a second input output port 27 of LFSR 110 to produce a sum signal which is coupled to binary summer 128. As a second input, binary summer 128 accepts the 15th tap of LFSR 110 to produce feedback signal 132. Those skilled in the art will appreciate that several combinations of taps are available. However the one described above is preferred.

LFSR 110 is operated open loop in the preferred embodiment of the present invention. Accordingly, feedback signal 132 is not applied to LFSR input 102 but instead, is applied as one input to binary summer 116. As a second input, binary summer 116 accepts the identical received synchronization sequence as applied to LFSR 110 at input port 102. The received synchronization sequence, although corrupted by noise in the channel, is typically generated in a LFSR identical to LFSR 110 of error corrector 100. The LFSR generating the sequence has output taps combined to form a feedback signal identical to those of LFSR 110 as will be hereinafter described in detail. Those skilled in the art will appreciate that if the generating LFSR and receiving LFSR have identical information contained in them, and a feedback signal formed by identical combination of output taps, feedback signal 132 will be identical to the received sequence applied to binary summer 116. Therefore, binary summer 116 will be adding (modulo 2) two identical signals. Accordingly, the output of binary summer 116 will always be at a logic "0" state. The only instance in which the output of binary summer 116 would be at the logic "1" state is the case where the receive synchronization sequence and feedback signal 132 are not identical (i.e. one of the signals is in error). Therefore, the output of binary summer 116 forms an intermediate signal 104 providing a logic "1" indication whenever the received synchronization sequence does not match the expected synchronization sequence.

Intermediate signal 104 is applied as one input to binary summer 118. The second input, binary summer 118 accepts syndrome correction bit 134 the origin of which will be hereinafter described in greater detail. Syndrome correction bit 134 is a signal used to correct a bit in error. Accordingly, syndrome correction bit 134 is normally in the logic "0" state and is only in the logic "1" state after it is determined that an error in fact exists. The output of binary summer 118 is an error estimation signal which is applied to input port 106 of syndrome register 112. Syndrome registers are well known in the art and the purpose of syndrome 112 is to temporarily store the last N error estimation signal bits providing output ports along its entire length to be used to make a determination of an error. Typically, syndrome registers have input ports used to accept correction bits which invert the data bits to the alternate state (i.e. logic "0" state to a logic "1" or vice versa). Syndrome register 112 differs from those in the prior art in that the register has been lengthened. In the present invention, this is a result of the orthogonal convolutional code generated by the LFSR at the transmitter which is inherently redundant. Accordingly, the preferred syndrome register is 64 bits in length which allows more output ports of syndrome register 112 to be examined thus providing an improved error determination. The particular selected output ports of syndrome register 112 correspond to the taps of LFSR 110 subtracted from 64 (i.e. the length of LFSR 110). Accordingly, error indication bit 104 is virtually the 0th syndrome bit (i.e. 64 minus the 64th tap). Additionally, taps are placed at the second syndrome register bit (i.e. 64 minus 62nd tap), the 18th output port (i.e. 64 minus 46th tap) and so on generating a total of seven syndrome bits. A significant improvement to syndrome register 112 of the present invention is the inclusion of the 64th output port of syndrome register 112. This corresponds to the 64 minus 0 or 64th error indication bit in syndrome register 112. The additional tap allows a majority threshold decoder 114 to have the advantage of an additional error estimation bit on which to base its decision that an error was in fact received.

Accordingly, the purpose of majority threshold 114 is to examine several syndrome bits and assert its output whenever a majority of the selected syndrome bits are at the logic "1" state. Majority threshold decoders are well known in the art in varied implementations. In the prior art the majority threshold is set to greater than $M/2$ (where M is the number of syndrome bits examined). Generally, the more input signals used to determine the majority threshold, the better the probability of accurately determining when to assert the output signal. In the present invention an improvement is obtained if the threshold of this majority decision is greater than $M/2+1$. In the preferred embodiment of the present invention, majority threshold decoder 114 has 7 inputs. The 7 inputs include the 6 register output ports and the error indication signal 104. Thus, in the preferred embodiment, majority threshold decoder 114 will assert output 134 whenever 5, 6 or all 7 of its input ports are at logic "1" state (i.e. $7/2+1=4.5$ thus, in whole numbers, 5, 6 or 7 will indicate a majority). Majority threshold decoder 114 outputs syndrome correction bit 134 which is used to correct the synchronization bit that has been determined to be in error. Accordingly, syndrome correction bit 134 is applied as one input to binary summer 130. As a second input, binary summer 130 accepts the last output tap of LFSR 110. Because of the delay in the syndrome register, this is the synchronization bit to be corrected. In the preferred embodiment the length of LFSR 110 is 64 bits, thus, the second input to binary summer 130 is the 64 th bit. Those skilled in the art will appreciate that syndrome correction bit 134 is normally at logic "0". Thus, a "0" is applied to binary summer 130 and has the effect of simply passing whatever logic state is applied to its second port to output port 136. Therefore, a logic "0" state for syndrome correction bit 134 will not affect the output of LFSR 110. However, whenever syndrome correction bit 134 is in the logic "1" state the effect on an incoming bit to binary summer 130 is to "invert" or flip that bit to the alternate logic state. Therefore, a bit determined not to be in error (i.e. syndrome correction bit 134 at logic "0") is unaffected while a bit determined to be in error (syndrome correction bit 134 at logic "1" state) is inverted to the alternate logic state to correct the error.

Syndrome correction bit 134 is also applied to a plurality of input ports on syndrome register 112. As previously described, a typical syndrome register accepts inputs to invert selected bits to the alternate logic state. The reason for this is that the data contained in syndrome register 112 are error indication signals. Thus, whenever majority threshold decoder 114 determines that an error in fact exists, and thereby corrects the error, then the error indication signals in syndrome register 112 benefit by correction. Therefore, syndrome correction bit 134 inverts the error indication signals to the alternate logic state. This reduces the number of error indication bits contained in syndrome register 112.

In the preferred embodiment, syndrome correction bit 134 is applied to binary summer 118 to correct input 106 to the syndrome register as well as the 3rd, 19th, 27th, 38th and 50th input ports of the syndrome register. These correspond to the syndrome register output taps plus one bit. This selection is made because majority threshold decoder 114 corrects the received bit in error at the beginning of the clock cycle but the syndrome correction bit 134 is not latched into syndrome register 112 until the next clock cycle. Thus, the error indication bits have shifted over by one position. Note that no syndrome correction bit is required for the 64th syndrome register bit since in the preferred embodiment the length of syndrome register 112 is 64 bits and on the next clock cycle that bit is simply discarded.

As an example of the operation of error corrector 100, suppose that the previous 128 bits have been correct and that input 102 is in error. Therefore, the output of binary summer 116 would be at the logic "1" state since it would not match feedback signal 132. Thus, an error indication bit will be clocked in syndrome register 112 since it is summed in binary summer 118 with syndrome correction bit 134 which is currently at the logic "0" state. On the next clock cycle, the error indication bit will be in the second position and the second output port of syndrome register 112 will assert. However, syndrome correction bit 134 will not assert since majority threshold decoder 114 has only one of 7 inputs asserted and requires at least 5 before asserting syndrome correction bit 134. Subsequent clock cycles will shift the input error bit across LFSR 110 and the first error indication bit across syndrome register 112. However, no further error indication bits will be clocked into syndrome register 112 until the bit in error reaches the 15th tap of LFSR 110. On the 15th clock cycle the error bit arriving at 15 will cause feedback signal 132 to differ from the received signal applied as a second input to binary summer 116. Accordingly, another error indication bit will be generated and clocked into syndrome register 112. The above described process will continue until the bit in error has been clocked all the way through the entire length of LFSR 110. Thus, from the initial receipt of the error, it will take 64 clocks to allow the error to propagate through LFSR 110. In total, for this example, 7 error indication bits will ultimately be generated (6 residing in syndrome register 112 and the 7th taken from the intermediate signal). Accordingly, having 7 error indication bits (which is more than the 5 error indication bits required as a minimum threshold for majority threshold decoder 114) syndrome correction bit 134 will assert and apply a logic "1" to binary summer 130. Contemporaneously, the original bit received in error will be at the output of LFSR 110 and applied as a second input to binary summer 130. This will result in the inversion of the bit in error to its alternate logic state, thus, correcting the error. The corrected bit will be at output port 136 and may be applied to whatever synchronization detecting means as may be practical to employ in the receiver. Further, syndrome correction bit 134 is applied to five selected input ports of syndrome register 112, and is used a second input to binary summer 118. Thus, on the next clock cycle, bits 1, 3, 19, 27, 28 and 50 are changed to the alternate logic state and latched into syndrome register 112 (recalled that these bits were error indication bits and had the logic state of "1"). Therefore, all error indication bits associated with receiving the bit in error are inverted to their original state indicating that no error currently exists.

Figure 2:
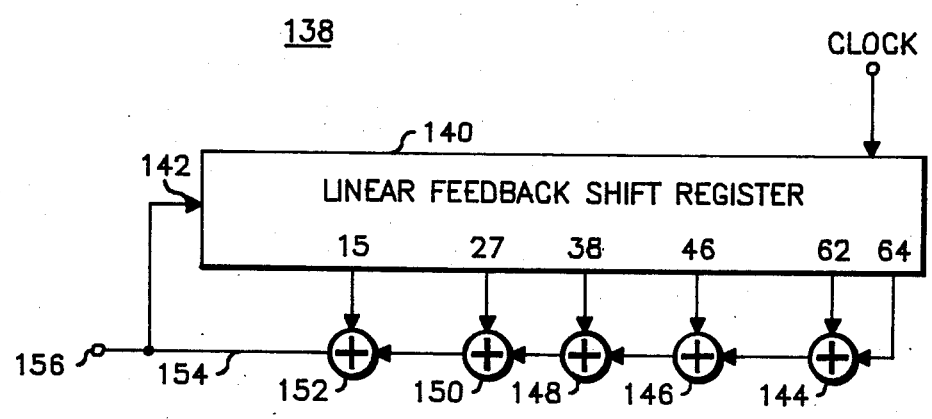
FIG. 2 is a block diagram of a linear feedback shift register that may be used to generate the sequence corrected in FIG. 1.

Referring now to FIG. 2, the preferred embodiment of generating the linear feedback shift register sequence, which is used as the synchronization information, is depicted in block diagram form. Basically, sequence generator 138 is comprised of LFSR 140 which has output taps selected identical to those of LFSR 110 of FIG. 1. Those skilled in the art will appreciate that sequence generator 138 can be analogized to a standard rate one-half convolutional coder where the parity signal is applied (at input port 142) as the information signed to LFSR 140 thereby forming a rate one convolutional code. These taps are summed identically as the taps in LFSR 110 using binary summers 144 through 152 to produce feedback signal 154. However, the LFSR in sequence generator 138 is operated closed loop. Thus, feedback signal 154 is applied both as a input to LFSR 140 (at input port 142) and, as an output at port 156 to be applied to whatever transmitting means may be appropriate for the communications system involved. Thus, on every clock cycle, the feedback signal is clocked back through LFSR 140 which forms a maximal length LFSR sequence which is inherently redundant. A sequence generated in a LFSR is maximal length if the total number of bits outputed at port 156 is equal to $2^N-1$ bits before the LFSR sequence is repeated. Therefore, in the preferred embodiment of the present invention a 64 bit LFSR is employed thus providing $2^{64}-1$ or approximately $1.84\times10^{19}$ bits before the sequence is repeated. A LFSR sequence of this length renders the present invention useful in data encryption systems which require long pseudo-random bit sequences.

The selected output taps of LFSR 140 form an orthogonal convolutional code. Generally, the generated sequence produced by LFSR 138 can be described by the equation:

$$G(X) = X^{64} + X^{62} + X^{46} + X^{38} + X^{27} + X^{15} + 1.$$

Those skilled in the art will appreciate that many possible codes may be implemented using a LFSR. However, not all combinations of output ports produce orthogonal or semiorthogonal convolutional codes. The preferred embodiment of the present invention selects the output ports to be combined at the 15th, 27th, 38th, 46th, 62nd and 64th output ports thus producing an inherently redundant orthogonal code.

While a particular embodiment of the invention has been described and shown, it should be understood that the invention is not limited thereto since many modifications can be made. It is therefore contemplated to cover the present application any and all modifications that may fall within the true spirit and scope of the basic underlying principles disclosed and claimed herein.

What is claimed:

1. A circuit for correcting errors in a rate-one orthogonal convolutional code which further operates as a synchronization signal, comprising:
   open loop linear feedback shift register means having an input port for receiving a synchronization signal and a plurality of output ports arranged and combined to form a feedback signal;
   first combining means for combining said synchronization signal and said feedback signal to form an intermediate signal, which combined with a syndrome correction signal forms an error estimation signal;
   syndrome register means having a first input port for receiving said error estimation signal and a plurality of additional input ports for receiving said syndrome correction signal, said syndrome register means providing a plurality of output syndrome signals;
   majority decoder means for selectively receiving said intermediate signal and said output syndrome signals to provide said syndrome correction signal when a predetermined threshold is exceeded; and
   second combining means for combining said syndrome correction signal and a further output signal from said open loop linear feedback shift register means to yield a corrected synchronization signal.

2. The circuit of claim 1 wherein said first combining means further comprises:
   first binary summing means for receiving said synchronization signal and said feedback signal to provide said intermediate signal;
   second binary summing means for receiving said intermediate signal and said correction signal to yield said syndrome signal.

3. The combining means of claim 2, wherein said first and second binary summing means further comprises exclusive "OR" logic gates.

4. The circuit of claim 1, wherein said second combining means further comprises a binary summing means.

5. The combining means of claim 4 wherein said binary summer comprises an exclusive "OR" logic gate.

6. The circuit of claim 1, wherein the length of said open loop linear feedback shift register means and said syndrome register means are identical.

7. The circuit of claim 1, wherein said threshold of said majority decoder means is equal to $M/2+1$, where M equals the number of inputs ports of said majority decoder means.

8. In a synchronous data communication system having at least one transmitter, which interleaves a synchronization signal with an information signal, and at least one receiver, the improvement comprising:
at the transmitter:
   closed loop linear feedback shift register means having a plurality of outputs arranged and combined to form a feedback signal, and an input port for receiving said feedback signal, for providing a rate-one orthogonal convolutional code which represents the synchronization signal; and
at the receiver:
   open loop linear feedback shift register means having an input port for receiving a synchronization signal and a plurality of output ports arranged and combined to form a feedback signal;
   first combining means for combining said synchronization signal and said feedback signal to form an intermediate signal, which combined with a syndrome correction signal forms and error estimation signal;
   syndrome register means having a first input port for receiving said error estimation signal and a plurality of additional input ports for receiving a correction signal, said syndrome register means providing a plurality of output syndrome signals;
   majority decoder means for selectively receiving said intermediate signal and said output syndrome signals to provide said syndrome correction signal when a predetermined threshold is exceeded; and
   second combining means for combining said syndrome correction signal and a further output signal from said open loop linear feedback shift register means to yield a corrected synchronization signal.

9. In a synchronous data communication system having at least one transmitter, which provides a synchronization signal on an independent synchronization channel, and at least one receiver, the improvement comprising:
at the transmitter:
   closed loop linear feedback shift register means having a plurality of outputs arranged and combined to form a feedback signal, and an input port for receiving said feedback signal, for providing a orthogonal convolutional code which represents the synchronization signal; and
at the receiver:
   open loop linear feedback shift register means having an input port for receiving a synchronization signal and a plurality of output ports arranged and combined to form a feedback signal;
   first combining means for combining said synchronization signal and, said feedback signal to form an intermediate signal, which combined with a syndrome correction signal forms an error estimation signal;
   syndrome register means having a first input port for receiving said error estimation signal and a plurality of additional input ports for receiving said syndrome correction signal, said syndrome register means providing a plurality of output syndrome signals;
   majority decoder means for selectively receiving said intermediate signal and said output syndrome signals to provide said syndrome correction signal when a predetermined threshold is exceeded; and
   second combining means for combining said syndrome correction signal and a further output signal from said open loop linear feedback shift register means to yield a corrected synchronization signal.

10. A method for correcting errors in a rate-one orthogonal convolutional code which further operates as a synchronization signal, comprising the steps of:
   (a) receiving a synchronization signal;
   (b) providing a feedback signal from said received signal;

(c) combining said received signal and said feedback signal to provide an intermediate signal;

(d) combining said intermediate signal with a syndrome correction signal to provide an error estimation signal;

(e) operating on said error estimation signal and said syndrome correction signal to provide a plurality of output syndrome signals;

(f) operating upon said selected ones of said plurality of output syndrome signals and said intermediate signal to provide said syndrome correction signal;

(g) combining said syndrome correction signal and said received synchronization signal to provide a corrected synchronization signal.

* * * * *